United States Patent [19]
Fox

[11] Patent Number: 4,916,677
[45] Date of Patent: Apr. 10, 1990

[54] AUTOMATIC PERIOD AND FREQUENCY MEASUREMENTS

[75] Inventor: Henry G. Fox, Sherwood, Oreg.

[73] Assignee: Tektronix, Inc., Beaverton, Oreg.

[21] Appl. No.: 367,596

[22] Filed: Jun. 19, 1989

[51] Int. Cl.$^4$ .................... G04F 8/00; G01R 23/16
[52] U.S. Cl. .................................. 368/113; 368/117; 324/78 R
[58] Field of Search .................... 368/113–121; 324/77 R, 78 R, 77 CS; 315/367, 392

[56] References Cited

U.S. PATENT DOCUMENTS

| | | | |
|---|---|---|---|
| 3,436,756 | 4/1969 | Myers et al. | 368/113 |
| 3,891,920 | 6/1975 | Williams | 324/78 R |
| 4,238,727 | 12/1980 | Madni | 324/77 CS |
| 4,350,953 | 6/1982 | Best et al. | 368/115 |
| 4,527,907 | 7/1985 | Chan | 368/118 |
| 4,841,497 | 6/1989 | Bateman et al. | 368/113 |
| 4,855,968 | 8/1989 | Shank | 368/115 |
| 4,868,465 | 9/1989 | Stevens et al. | 315/392 |

Primary Examiner—Vit W. Miska
Attorney, Agent, or Firm—Francis I. Gray

[57] ABSTRACT

An automatic period and frequency measurement feature for an analog oscilloscope uses a single sweep signal and a delay trigger to detect edges. The sweep rate for the sweep signal is set to the highest rate that provides at least one cycle of the input signal on a display. By varying a programmable level that is compared with the sweep signal, a first event after the start of the sweep is searched for. Once a first event is located, then a second event is searched for in the same manner, reducing the sweep rate if necessary to provide the second event on the display. From the programmable levels corresponding to the first and second events a period and frequency are computed and displayed.

14 Claims, 3 Drawing Sheets

AUTOMATIC PERIOD AND FREQUENCY MEASUREMENTS

BACKGROUND OF THE INVENTION

The present invention relates to time interval measurements, and more particularly to an automatic period and frequency measurement feature for an analog oscilloscope having dual delay measurement capability that allows measurements to be made using a single sweep signal with a delayed trigger to detect edges.

An oscilloscope often is used to measure a time interval between events in an input signal. For example the period of a sine wave signal may be determined by measuring the interval between positive zero crossings of the signal, and the frequency determined from the inverse of the period. Traditionally such measurements are made using a display of the input signal on an oscilloscope screen. An operator determines the interval between the two events on the oscilloscope screen in units of "horizontal divisions" of a rectangular grid system superimposed over the input signal display. The operator multiplies the units by the sweep rate of the oscilloscope expressed in units of time/division to obtain the time interval. This crude measurement technique is slow and inaccurate.

To improve the accuracy of time interval measurements counter timers have been incorporated into oscilloscopes. The operator sets two cursors at the event points between which the time interval measurement is desired. The cursors determine trigger points on the horizontal sweep signal that initiate a counter/timer at the first cursor that counts the output pulses from a stable oscillator. The counter/timer is stopped at the second cursor, and the count is converted into the time interval by multiplying the count by the period of the oscillator output. Although this is an improvement in accuracy and speed, this technique requires the expense of the additional counter/timer hardware and the accuracy of positioning of the cursors by the operator.

A recent technique that does not use counter/timer hardware is disclosed in allowed co-pending U.S. patent application No. 07/213,645 filed June 30, 1988 by Gordon Wray Shank entitled "Time Interval Measurement System for Analog Oscilloscope." This technique uses both A and B ramp signals, with the A ramp signal triggering on a first event and the B ramp signal triggering on a second event. Initially both ramp signals trigger on the first event to set a first reference level, then the B ramp signal triggers on the second event and a second reference level is adjusted in an iterative procedure until both reference levels result in an indicator for both ramps occurring at the same time. The difference in levels between the two reference levels is converted into a time value for the interval between the two events. To obtain the most precise time interval measurements, both ramp signals may be characterized during calibration in the manner disclosed in co-pending U.S. patent application No. 06/902,363 filed Aug. 29, 1986 by Douglas Clifford Stevens and Henry Gregory Fox entitled "Sweep Generator Error Characterization" to compensate for sweep offset and nonlinearity.

What is desired is an automatic period and frequency measurement feature for an analog oscilloscope that provides accurate time interval measurements that is simpler than previous techniques.

SUMMARY OF THE INVENTION

Accordingly the present invention provides an automatic period and frequency measurement feature for an analog oscilloscope that uses a single sweep signal and a delay trigger to detect edges. The sweep rate for the sweep signal is set to the highest rate that provides at least one cycle of the input signal on a display. By varying a programmable level that is compared with the sweep signal, a first event after the start of the sweep is searched for. Once a first event is located, then a second event is searched for in the same manner, reducing the sweep rate if necessary to provide the second event on the display. From the programmable levels corresponding to the first and second events a period and frequency are computed and displayed.

The objects, advantages and novel features of the present invention are apparent from the following detailed description when read in conjunction with the appended claims and attached drawing.

DETAILED DESCRIPTION OF THE PREFERRED EMBODIMENT

Figure 1:
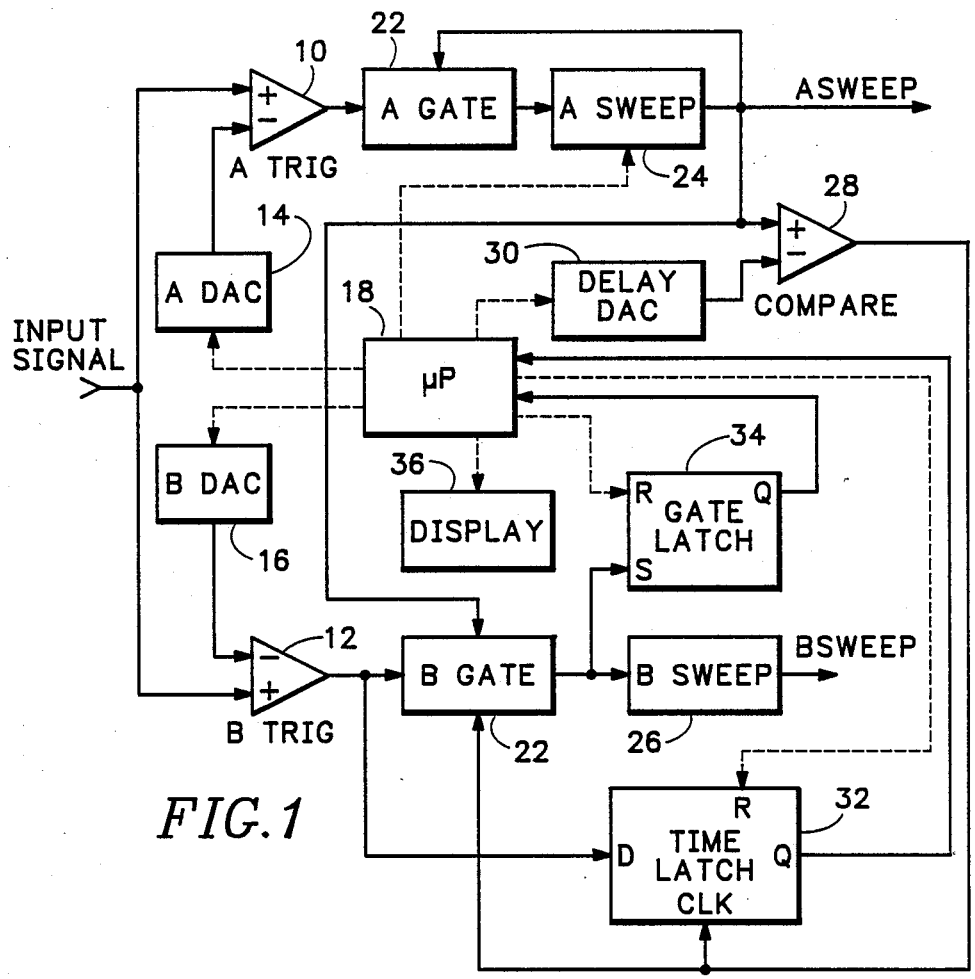
FIG. 1 is a block diagram of an analog oscilloscope suitable for the automatic period and frequency measurement feature of the present invention.

Referring now to FIG. 1 a portion of a conventional analog oscilloscope is shown. An input signal is input to respective A and B Schmitt trigger circuits 10, 12 to generate respective A and B trigger signals when the input signal exceeds a level determined by the outputs of respective digital to analog converters (DACs) 14, 16 that have values set by a microprocessor 18 according to a desired trigger level set by an operator on a front panel of the oscilloscope. The respective A and B trigger signals are input to respective A and B gate circuits 20, 22 that control respective A and B sweep circuits 24, 26 to produce ramp signals. The ASWEEP signal from the A sweep circuit 24 is input to both the A and B gate circuits 20, 22 to reset the outputs at the end of each A sweep cycle when the ramp signal reaches an end of sweep voltage. The A and B gate circuits 20, 22 remain disabled to respond to further trigger input signals until a predetermined hold off period expires. The A gate circuit 20 then responds to the next rising edge of the A trigger signal to start ASWEEP again, while the B gate circuit 22 responds to the first rising edge of the B trigger signal after the comparator 28 output goes high.

The ASWEEP signal also is input to a delay comparator 28 to provide an output when the level of the A sweep signal ramp exceeds a level determined by the output of a delay DAC 30 that is controlled by the microprocessor 18. The output of the comparator 28 enables the B gate circuit 22 so that it responds to the B trigger signal only when the A sweep ramp signal exceeds the level from the delay DAC 30, the resulting value for the delay DAC 30 establishing a known delay time since the A ramp signal rises linearly with time. The output of the comparator 28 also clocks a D-type flip-flop 32 to latch the status of the B trigger signal at that delay time for the microprocessor 18, and is used to detect B trigger levels. Finally an R/S flip-flop 34 is set by the output from the B gate circuit 22 to provide a B gate status indicator to the microprocessor 18 to indicate whether at least one cycle is encompassed within the sweep interval. The microprocessor 18 resets both the time latch 32 and the gate latch 34, as well as controlling the sweep rate of the A sweep generator 24.

Figure 2:
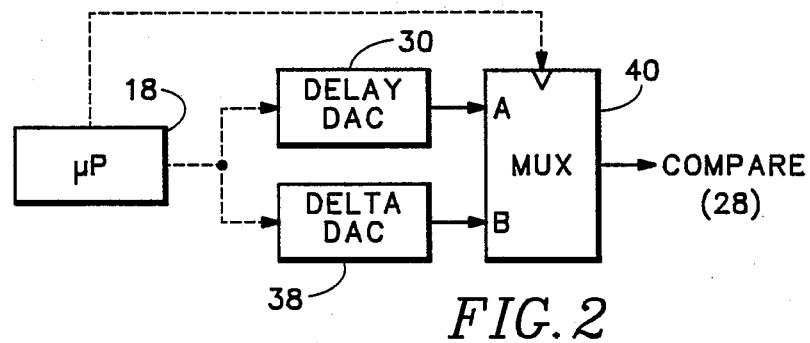
FIG. 2 is a block diagram of an alternative embodiment of a portion of the block diagram of FIG. 1.

The microprocessor 18 provides a delay count to the delay DAC 30 and, based upon the status from the gate and time latches 34, 32, changes the delay count until the count corresponds to a first event in the input signal after the start of the A sweep ramp signal, which event is the start of a desired interval measurement. Then the microprocessor 18 provides a new delay count that is approximately the difference between the start of the A sweep ramp signal and the first event added to the first event time and searches for another event corresponding to a second event that defines the end of the time interval for which the measurement is desired. The difference between the two event values for the delay DAC 30 is converted into a time value to determined the period of the input signal, and the inverse of the time value determines the frequency of the input signal. The resulting period and/or frequency value is displayed on a display 36. Alternatively, as shown in FIG. 2, the microprocessor 18 uses two DACs, the delay DAC 30 to determine the first event count and a delta DAC 38 to determine the second event count. A multiplexer 40, controlled by the microprocessor 18, selects the appropriate DAC 30, 38 as the input to the comparator 28. The display 36 may also include cursors at the two event times, or a "bright up" of the input signal between the two event times to indicate to the operator the interval being determined.

Figure 3:
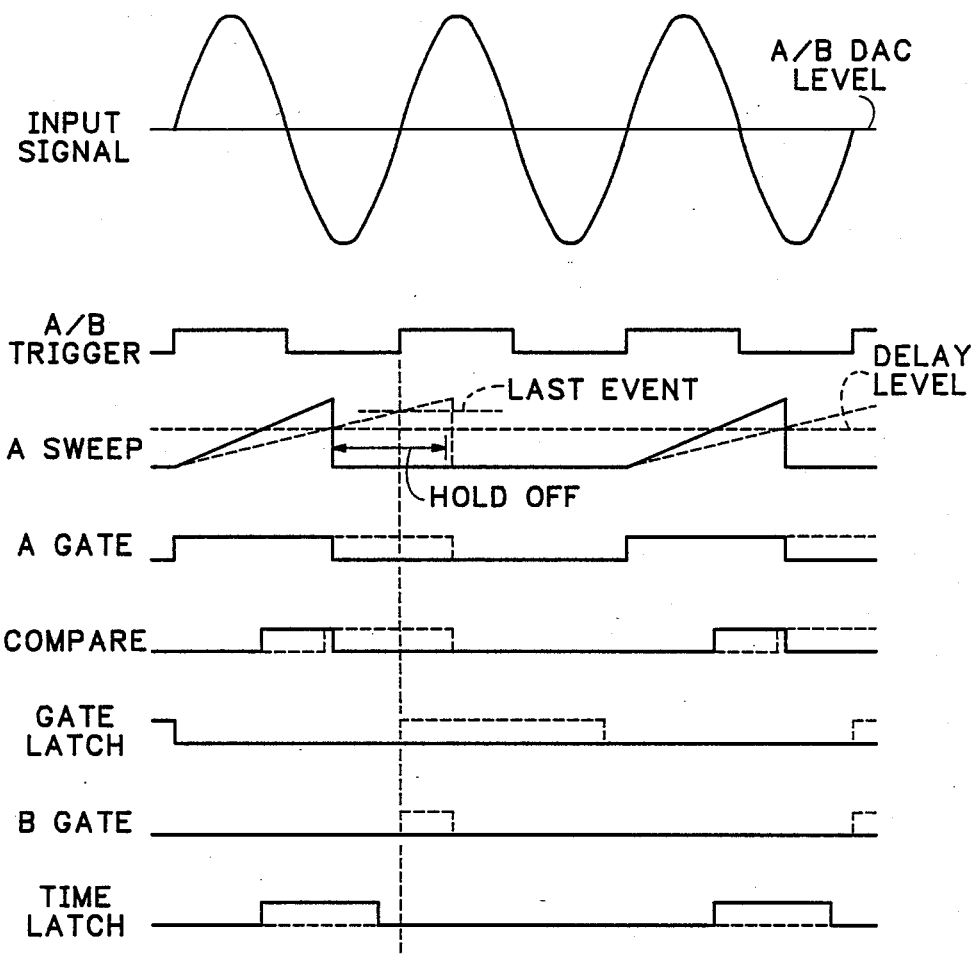
FIG. 3 is a timing diagram for the analog oscilloscope of FIG. 1 illustrating the operation of the automatic period and frequency measurement feature of the present invention.

FIG. 3 illustrates the operation of the automatic period and frequency measurement feature with respect to the various timing diagrams for the circuit of FIG. 1. Assuming that it is desired to determine the period of an input signal that is in the form of a sine wave, the A and B DAC 14, 16 levels are set to be the zero level for the sine wave using standard automatic set up techniques, such as those described in U.S. Pat. No. 4,743,844 issued May 10, 1988 to Ronald P. Odenheimer entitled "Self-Adjusting Oscilloscope", to determine gain, sweep rate and d.c. offset so that the display has a centered image of the input signal. As part of the automatic set up procedure at least one cycle of the sine wave is displayed. The outputs of the A and B trigger circuits 10, 12 are square waves that change state at each zero crossing of the input sine wave, ignoring hysteresis effects. The leading edge of the A trigger signal generates an A gate signal from the A gate circuit 22 that in turn starts the ramp signal from the A sweep circuit 24. When the end of sweep level is reached by the A ramp signal, the A gate signal returns to zero, terminating the A ramp signal. If the A gate signal encompasses less than one cycle of the input signal, as shown by the solid lines in FIG. 3, then the output of the comparator 28 that enables the B gate circuit 22 occurs between rising edges of the B trigger signal so that there is no output from the B gate circuit 22. With the gate latch 34 in its reset state, the Q output remains zero. The microprocessor 18 decreases the sweep rate as shown by the dotted lines in FIG. 2 so that the ramp signal encompasses at least one cycle of the input signal. Now the output of the comparator 28 extends over the leading edge of the next B trigger signal to generate an output from the B gate circuit 22 that sets the gate latch 34, indicating to the microprocessor 18 that at least one cycle is displayed.

Then the value of the delay DAC 30 is altered until a change in the least significant bit results in a change in the output of the time latch 32. The delay DAC value at this point indicates the time of the first event from which a time interval is to be measured only if there is only one cycle per ASWEEP. In the event there is more than one cycle per sweep, then a first event is searched for between the start of the sweep and the event found above, again by varying the DAC 30 value, but about an interval between the start and the found event that encompasses the probable location of another event. This process is reiterated, if necessary, until the first event after the start of the sweep is located. The sweep rate is then changed, if necessary, to encompass at least two cycles of the input signal, the first event time in DAC units being converted for the new sweep rate. A search is conducted about a point approximately one period from the first event by varying the DAC 30 value to determine a DAC value for the second event. The difference in the DAC values for the two events is the period of the input signal.

Figure 4:
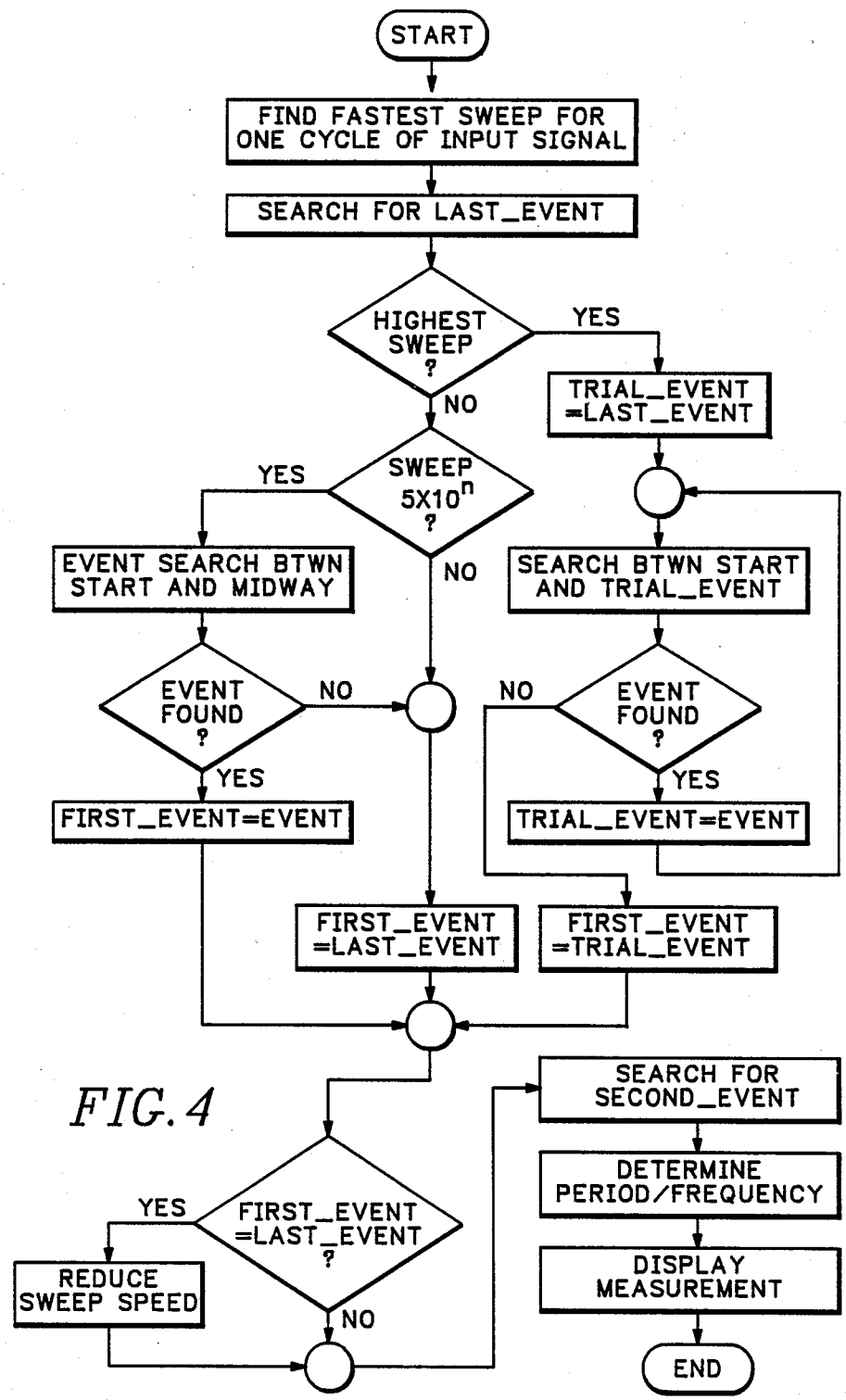
FIG. 4 is a flow chart diagram of the operation of the automatic period and frequency measurement feature of the present invention.

As shown in FIG. 4 the first step is to set up the oscilloscope for the fastest sweep rate that displays at least one cycle of the input signal. The delay DAC value is set to a value somewhere after the start of the A sweep signal and before the middle of the A sweep signal so that a B gate signal can occur between that time and the end of the A sweep signal if there is a B gate signal during that time. The B gate latch 22 is reset by the microprocessor 18, the A sweep signal is begun at the fastest available rate, and the B gate latch is checked by the microprocessor after at least one sweep to see if a B gate signal has occurred. If there has been a B gate signal, then at least one cycle of the input signal has been completed. Otherwise the process is repeated at succeeding slower sweep rates until a sweep rate is found that results in a B gate signal.

Next the delay DAC value is found such that the delay output from the comparator 28 matches the last B trigger event during the sweep. This may be done using a successive approximation binary search with the delay DAC 30 to find the border between a delay DAC value that allows a B gate signal to occur or not. The B gate signal is detected by the gate latch 34, but it is the DAC value that is changed rather than the sweep rate. The DAC value found is stored as LAST_EVENT.

If the sweep speed is set to the highest possible speed for the instrument, then it is not known how many cycles of the input signal occur within the interval between the DAC values START_SWEEP and LAST_EVENT. Therefore it is necessary to search for a first event between START_SWEEP and LAST_EVENT. To search for such intermediate events, a TRIAL_EVENT is set to the value for LAST_EVENT and a search for another event is conducted between specified limits. Since the number of cycles may be either odd or even, the limits must be broad enough to encompass such an eventuality. One set of suitable limits are:

LOW_LIMIT=(LAST_EVENT-START_SWEEP)/4+START_SWEEP−e
HI_LIMIT=(LAST_EVENT-START_SWEEP)*3/4+START_SWEEP+e where START_SWEEP, LAST_EVENT and e are in DAC values, and e represents the calculated worst case uncertainty in the time interval measurement due to offset, slope or non-linearity of the sweep ramp or to inaccuracy of the delay DAC 30. A search is conducted between these limits by varying the delay DAC value as described above, and if a B trigger edge is found, the TRIAL_EVENT is set to the value of the new event. The search is reiterated with the value of TRIAL_EVENT replacing the value of LAST_EVENT in the limit equations until no new events are found. At that point FIRST_EVENT is set equal to TRIAL_EVENT.

Another situation that could give a sweep rate that includes more than one cycle results from the fact that sweep rates usually increment in a 1-, 2-, 5- sequence of time per division values. If an input signal has a 23 msec period, then at a sweep rate of 2 msec per division for a sweep interval of 10 divisions there are no B trigger events, but at a sweep rate of 5 msec per division there are two cycles of the input signal within the sweep interval. Therefore the microprocessor checks at this point to see if the sweep speed is five times some power of ten. Since there can only be two cycles per sweep maximum for this sweep rate, the end of the first period occurs within the limits (LAST_EVENT-START_SWEEP)/2+START_SWEEP+/−e.

The time latch 32 indicates the delay DAC value at which the B trigger event changes state from low to high, indicating the B trigger event. If such an event is detected, then FIRST_EVENT=NEW_EVENT. In all other situations there is only one cycle per sweep interval, and FIRST_EVENT=LAST_EVENT.

At this point with the value of FIRST_EVENT and the value of START_SWEEP, the time of one period is approximately known, and could be converted to appropriate time units and displayed. However, the beginning of the sweep signal is likely to be less predictable than the rest, so for greater accuracy another event is determined. If FIRST_EVENT=LAST_EVENT, then there is only one cycle per sweep interval, so it is necessary to change the sweep rate to bring the second event within the sweep interval. FIRST_EVENT then is converted into a new delay DAC value for the new sweep rate according to the following equation:

FIRST_EVENT=(FIRST_EVENT-START_SWEEP)*TD1/TD2+START_SWEEP.

This assumes that the DAC code per division and START_SWEEP are the same for both sweep rates. For greater accuracy characterized values for the sweep rates are used for the conversion, as described in co-pending U.S. patent application No. 06/902,363 filed Aug. 29, 1986 by Douglas Clifford Stevens and Henry Gregory Fox entitled "Sweep Generator Error Characterization." For even further accuracy a new search for FIRST_EVENT within the limits FIRST_EVENT +/−e may be made to determine a refined value for FIRST_EVENT. The next event occurs within the limits:

2*(FIRST_EVENT-START_SWEEP)+START_SWEEP+/−e.

A search within these limits results in a delay DAC value for the next B trigger event, SECOND_EVENT. For the instances where more than one cycle occur within the sweep interval there is no conversion required, the next event search limits are computed, and the SECOND_EVENT value is determined as described above.

The difference between SECOND_EVENT and FIRST_EVENT is the desired period of the input signal in DAC code units, with frequency being the reciprocal of this value. Using the designed or, for greater accuracy, the characterized value of DAC code per unit of time, these values are converted into time or frequency units. Because the result is the difference between two delay values, uncertainties relating to the start of sweep and non-linearities at the beginning of the sweep tend to cancel, resulting in an accurate measurement if delay DAC code per unit of time for each sweep rate is well characterized, as described in the above Stevens et al application.

The value of the period and/or frequency is displayed by the microprocessor 18 on the display device 36. Leaving the FIRST_EVENT value in the delay DAC 30 and the SECOND_EVENT value in the delta DAC 38, the values may be used to generate cursors on the display to indicate to the operator the portion of the input signal being measured, or alternatively the portion of the input signal between the first and second events may be highlighted, or brightened, or the start of each cycle may be highlighted, to indicate the actual period being measured to provide operator confidence in the measurement.

Thus the present invention provides an automatic period and frequency measurement feature for an analog oscilloscope that accurately determines the times of events that bound a desired time interval for an input signal. The technique uses a single sweep signal and a delayed trigger signal, the value of the delay to each event from the start of the sweep signal being used to determine the period and frequency of the input signal. The first and second events may be used to trigger cursors at those points on the display, or to highlight the display trace between the events.

What is claimed is:

1. A method of automatically determining a time interval between two events in an input signal comprising the steps of:
    initiating a sweep signal at a measurement sweep rate having a sweep interval that encompasses at least one cycle of the input signal;
    searching the input signal during the sweep interval for a first event as a function of a programmable delay time from the start of the sweep interval, the programmable delay time when the first event occurs being a first event time;
    searching the input signal during the sweep interval for a second event that occurs after the first event as a function of the programmable delay time, the programmable delay time when the second event occurs being a second event time; and
    computing the time interval between the first and second event times.

2. A method as recited in claim 1 wherein the initiating step comprises the steps of:
    generating a delay interval as a function of the programmable delay time and the sweep signal, the sweep signal initially having a sweep rate that is the highest sweep rate available from a plurality of sweep rates;
    testing to determine whether a trigger signal indicating the completion of at least one cycle of the input signal occurs during the delay interval;
    resetting the sweep rate to a lower sweep rate when the trigger signal does not occur during the delay signal interval; and
    repeating the generating, testing and resetting steps at the lower sweep rate until the trigger signal occurs during the delay interval, the sweep rate when the trigger signal occurs during the delay interval being the measurement sweep rate such that the measurement sweep rate is the highest available sweep rate that provides the sweep interval that encompasses at least one cycle of the input signal.

3. A method as recited in claim 2 wherein the generating step comprises the steps of:
    determining levels that represent the start and end of the sweep interval;
    determining a delay level between the start level and a level representing the middle of the sweep interval, the delay level corresponding to the programmable delay time and the start level corresponding to the start of the sweep signal; and
    comparing the delay level with the sweep signal to produce the delay interval when the level of the sweep signal exceeds the delay level.

4. A method as recited in claim 3 wherein the testing step comprises the steps of:
    generating the trigger signal at the completion of each cycle of the input signal;
    enabling a gate circuit during the delay interval; and
    triggering the gate circuit to produce an output when the trigger signal occurs while the gate circuit is enabled to indicate completion of at least one cycle of the input signal.

5. A method as recited in claim 1 wherein the first event searching step comprises the steps of:
    determining a last event as a function of the programmable delay time and a trigger signal indicative of when a last cycle of the input signal is completed within the sweep interval, the programmable delay time when the last event occurs being a last event time;
    determining whether more than one cycle of the input signal occurs during the sweep interval;
    setting the first event time equal to the last event time when only one cycle of the input signal occurs during the sweep interval;
    searching for events intermediate the start of the sweep interval and the last event time as a function of the programmable delay time until an event occurs indicating the end of the first cycle of the input signal when more than one cycle occurs during the sweep interval, the programmable delay time when the event being an intermediate event time; and
    setting the first event time equal to the intermediate event time when more than one cycle of the input signal occurs during the sweep interval.

6. A method as recited in claim 5 wherein the intermediate event searching step comprises the steps of:
    establishing delay time limits about the center of the sweep interval, the delay time limits being a function of the number of possible cycles of the input signal within the sweep interval; and
    varying the programmable delay time between the delay time limits until the event occurs indicating the completion of the first cycle of the input signal within the delay time limits, the programmable delay time when the event occurs being the intermediate event time.

7. A method as recited in claim 6 wherein the establishing step comprises the steps of:
    determining whether the measurement sweep rate is the highest sweep rate available; and
    setting a low limit for the delay time limits according to the equation (FIRST_EVENT−START_SWEEP)/4−e where FIRST_EVENT is the first event time, START_SWEEP is a time representative of the start of the sweep signal, and e is a tolerance value, and setting a high limit for the delay time limits according to the equation 3*(FIRST_EVENT−START_SWEEP)/4+e, the low and high limits being set when the measurement sweep rate is the highest sweep rate available.

8. A method as recited in claim 6 wherein the establishing step comprises the steps of:
    determining whether the measurement sweep rate is a multiple of greater than two of the next highest available sweep rate;
    setting the delay time limits according to the equation $$(\text{FIRST\_EVENT} - \text{START\_SWEEP})/2 +/- e$$

where FIRST_EVENT is the first event time, START_SWEEP is a time representing the start of the sweep signal, and e is a tolerance value, the delay time limits being set when the measurement sweep rate is a multiple greater than two of the next highest available sweep rate.

9. A method as recited in claim 1 wherein the second event searching step includes the steps of:
    determining whether the measurement sweep rate includes more than one cycle of the input signal within the sweep interval;
    lowering the measurement sweep rate to a next lowest available sweep rate that includes at least two cycles of the input signal within the sweep interval and setting the first event time to a new first event time for the next lowest available sweep rate converted from the first event time as a function of the ratio of the two sweep rates when the measurement sweep rate includes only one cycle within the sweep interval; and
    varying the programmable delay time within delay time limits that encompass the portion of the sweep interval where the second event is expected to occur to find the second event, the programmable delay time when the second event occurs being the second event time.

10. A method as recited in claim 9 wherein the varying step comprises the step of establishing the delay time limits according to the equation $$(\text{FIRST\_EVENT} - \text{START\_SWEEP}) + \text{FIRST\_EVENT} +/- e$$

where FIRST_EVENT is the first event time, START_SWEEP is a time representing the start of the sweep signal, and e is a tolerance value.

11. A method as recited in claim 1 further comprising the step of displaying the time interval as an alphanumeric value on a display device.

12. A method as recited in claim 11 wherein the displaying step comprises the step of highlighting the time interval on an analog representation of the input signal appearing on the display device.

13. A method as recited in claim 12 wherein the highlighting step comprises the step of generating cursors for display on the display device that occur at times during the sweep signal corresponding to the first and second event times.

14. A method as recited in claim 12 wherein the highlighting step comprises the step of brightening the analog representation of the input signal between the times corresponding to the first and second event times.

* * * * *